US008139075B2

(12) United States Patent
Cohen et al.

(10) Patent No.: US 8,139,075 B2
(45) Date of Patent: Mar. 20, 2012

(54) COLOR PACKING GLYPH TEXTURES WITH A PROCESSOR

(75) Inventors: Miles Mark Cohen, Seattle, WA (US); Anthony John Rolls Hodsdon, Seattle, WA (US); Louri Vladimirovitch Tarassov, Bellevue, WA (US); Niklas Erik Borson, Langley, WA (US); Mark Andrew Lawrence, Bainbridge Island, WA (US); Mikhail Mikhailovich Lyapunov, Woodinville, WA (US); Benjamin C. Constable, Redmond, WA (US); Christopher Nathaniel Raubacher, Redmond, WA (US)

(73) Assignee: Microsoft Corp., Redmond, WA (US)

( * ) Notice: Subject to any disclaimer, the term of this patent is extended or adjusted under 35 U.S.C. 154(b) by 669 days.

(21) Appl. No.: 12/331,657

(22) Filed: Dec. 10, 2008

(65) Prior Publication Data

US 2010/0141670 A1 Jun. 10, 2010

(51) Int. Cl.

| | |
|---|---|
| ***G06T 11/20*** | (2006.01) |
| ***G06T 11/00*** | (2006.01) |
| ***G09G 5/00*** | (2006.01) |
| ***G06K 9/00*** | (2006.01) |
| ***G06K 9/36*** | (2006.01) |
| ***H04N 1/40*** | (2006.01) |
| ***G03F 3/08*** | (2006.01) |

(52) U.S. Cl. ........ 345/582; 345/636; 345/660; 345/441; 345/467; 358/1.9; 358/2.99; 358/518; 382/166; 382/232; 382/260; 382/298

(58) Field of Classification Search .................. 345/636, 345/660, 441, 467–472, 428, 581, 589, 582, 345/606, 611, 418, 501; 358/1.9, 2.1, 2.99, 358/3.01, 512, 518, 462, 470; 382/162, 166–167, 382/232–233, 237, 254, 260–269, 274, 276, 382/293, 295, 298–299, 300
See application file for complete search history.

(56) References Cited

U.S. PATENT DOCUMENTS

| | | | | |
|---|---|---|---|---|
| 5,940,080 | A | 8/1999 | Ruehle | |
| 7,142,220 | B2 | 11/2006 | Platt | |
| 7,212,204 | B2 | 5/2007 | Farinelli | |
| 7,324,696 | B2 | 1/2008 | McElvain | |
| 7,358,975 | B2 | 4/2008 | Wetzel | |
| 2003/0098357 | A1 * | 5/2003 | Cummings et al. | 235/494 |
| 2004/0151398 | A1 * | 8/2004 | Betrisey et al. | 382/260 |
| 2005/0219247 | A1 * | 10/2005 | Arnold et al. | 345/467 |
| 2005/0229251 | A1 | 10/2005 | Chellapilla | |
| 2006/0170944 | A1 * | 8/2006 | Arps et al. | 358/1.13 |
| 2007/0002071 | A1 | 1/2007 | Hoppe | |
| 2007/0188497 | A1 * | 8/2007 | Dowling et al. | 345/469 |
| 2008/0079744 | A1 | 4/2008 | Xu | |
| 2008/0095237 | A1 | 4/2008 | Hussain | |

OTHER PUBLICATIONS

Green, Chris, Improved Alpha-Tested Magnification for Vector Textures and Special Effects, Valve Corporation (2007).
Hogskola Tekniska, Lunds, Font Rasterization for Mobile Devices (Jun. 27, 2008).

* cited by examiner

*Primary Examiner* — Wesner Sajous
(74) *Attorney, Agent, or Firm* — Shook, Hardy & Bacon

(57) ABSTRACT

A system, a method and computer-readable media for rendering text with a graphics processing unit (GPU). The system, method, and media includes a GPU that may be configured to receive a plurality of compressed glyph bitmap and create a plurality of glyph textures from the bitmap. The GPU may be further configured to pack a plurality of rows of data from a glyph bitmap into a single row of a glyph texture. The GPU may be also be configured to merge the plurality of glyph textures into a merged texture to identify overlapping rows of color. Additionally, the GPU maybe configured to filter the merged texture to create a grayscale texture containing a plurality of merged glyphs and rendering the grayscale texture to display the plurality of merged glyphs.

20 Claims, 13 Drawing Sheets

COLOR PACKING GLYPH TEXTURES WITH A PROCESSOR

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

A glyph is an image used to visually represent a character or characters. For example, a font may be a set of glyphs where each character of the font represents a single glyph. However, a glyph may also include multiple characters of a font and vice versa. That is, one character of a font may correspond to several glyphs or several characters of a font to one glyph. In other words, a glyph is the shape of a series of curves that delimit the area used to represent a character or characters. The computer-implemented process used to generate glyph curves and the resulting characters is referred to as text rendering.

Rendering text can be one of the more expensive operations in terms of central processing unit (CPU) usage. One process for rendering text includes the four step process of rasterizing, merging, filtering, and blending. The rasterizing step includes converting the glyph curves to a bitmap. The format of the bitmap is typically 1-bit-per-pixel and it may be "overscaled" in one or more directions. For example, the bitmap may be overscaled in the vertical or horizontal direction. Overscaling refers to a process where each bit of data, or texel, used to generate the bitmap is smaller than the pixel used to display the glyph.

The merging step includes merging nearby glyphs to prevent artifacts or undesirable characters. For example, anti-aliasing (including sub-pixel rendering) involves drawing some pixels semi-transparently. Because each glyph may be drawn independently, it is possible for the same pixel to be drawn semi-transparently multiple times in locations where the glyphs overlap. This may result in the pixel appearing too dark. To avoid this, the merging step combines the bitmaps for all the glyphs into a single texture. The filtering and blending steps are performed on the single texture rather than separately for each glyph. Thus, the merging steps combines the individual glyphs to achieve a continuous appearance and ensure there are not overlapping or separated glyphs.

The filtering step takes the merged glyphs and calculates the "coverage" for each pixel. The term coverage refers to determining the necessary intensity or value for each individual pixel used to display the merged glyphs. For example, a pixel that falls completely within the area of the glyph curve would have a 100% coverage. Likewise, a pixel that is completely outside the area of the glyph curve would have 0% coverage. Thus, the coverage value may fall anywhere in between 0% to 100% depending on the particular filtering method used for rendering the glyph.

The blending step may include sub-pixel rendering to improve the readability of the characters by exploiting the pixel structure of a Liquid Crystal Display (LCD). Specifically, sub-pixel rendering is possible because one pixel on an LCD screen is composed of three sub-pixels: one red, one green, and one blue (RGB). To the human eye these sub-pixels appear as one pixel. However, each of these pixels is unique and may be controlled individually. Thus, the resolution of the LCD screen may be improved by individually controlling the sub-pixels to increase the readability of text displayed on the LCD.

One method to render the text is to perform the first three steps on the CPU. That is, the rasterizing, merging, filtering steps are performed on the CPU and the blending step is preformed on the graphic processing unit (GPU). In terms of CPU usage, the merging and the filtering steps are the most computational intensive. To alleviate this usage, graphics device platform platforms such as Graphic Device Interface (GDI) or Windows Presentation Foundation (WPF) may be configured to cache the results of these operations. However, caching only helps so long as the cache contains the right data. For example, when text reflows or font size changes it becomes necessary to recalculate the filtered results. This requires the CPU to repeat the rendering process by performing the steps discussed above. In other words, the data stored in the cache is no longer useful and new values have to be calculated. Also, caching the results of filtering is less effective than caching the results of rasterization because it is per-run rather than per-glyph. In short, merging nearby glyphs and performing filtering on the merged glyphs is taxing on the CPU and has a detrimental effect on the performance of the computer.

SUMMARY

Embodiments to the present invention meet the above needs and overcome normal deficiencies by providing systems and methods for merging and filtering glyph textures on a GPU. This helps to reduce the demand on the CPU and takes advantage of the hardware included in the GPU. This is accomplished by moving some of the steps performed on the CPU over to the GPU. Specifically, a compressed bitmap is transferred from the CPU to the GPU. The compressed bitmap is decompressed on the GPU rather than on the CPU. This conserves the CPU memory and also cuts down on the amount of data transferred from the CPU to the GPU. Additionally, the GPU may be used to pack and process grayscale texture into multiple color channels. This packing allows multiple pixels to be processed at one time and reduces the number of samples required in a shader. In sum, embodiments of the present invention provide a way to render text in a more computational efficient manner.

It should be noted that this Summary is provided to generally introduce the reader to one or more select concepts described below in the Detailed Description in a simplified form. This Summary is not intended to identify key and/or required features of the claimed subject matter, nor is it intended to be used as an aid in determining the scope of the claimed subject matter.

BRIEF DESCRIPTION OF THE SEVERAL VIEWS OF THE DRAWING

The present invention is described in detail below with reference to the attached drawing figures, wherein.

DETAILED DESCRIPTION

The subject matter of the present invention is described with specificity to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the term "step" may be used herein to connote different elements of methods employed, the term should not be interpreted as implying any particular order among or between various steps herein disclosed unless and except when the order of individual steps is explicitly described. Further, the present invention is described in detail below with reference to the attached drawing figures, which are incorporated in their entirety by reference herein.

The present invention provides an improved system and method for processing glyphs and rendering text. It will be understood and appreciated by those of ordinary skill in the art that a "glyph," as the term is utilized herein, refers to a visual representation of a character or characters. For example, a font may be a set a glyphs with each character of the font representing a single glyph. However, a glyph may also include multiple characters of a font and vice versa. An exemplary operating environment for the present invention is described below.

Figure 1A:
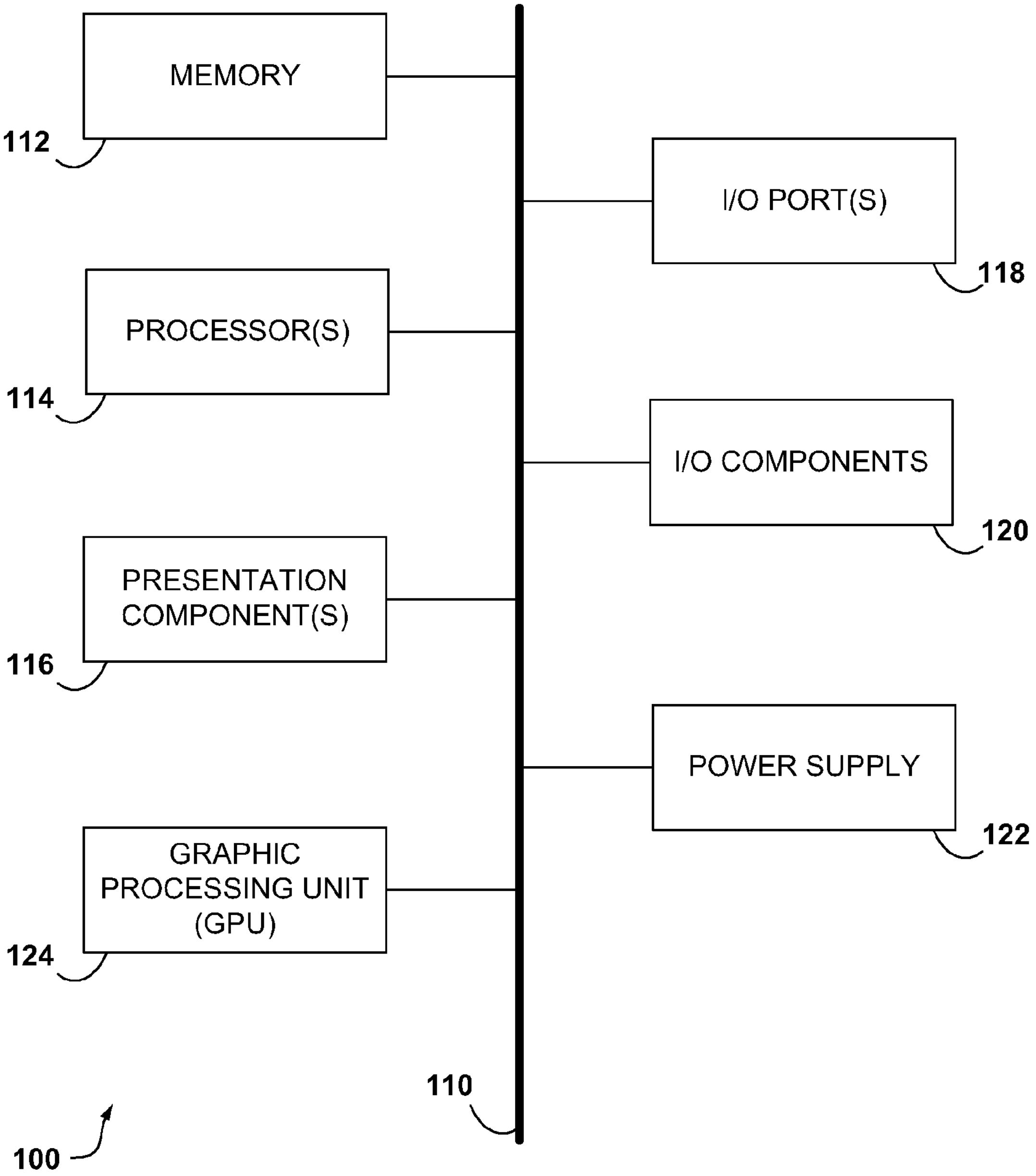
FIGS. 1A and 1B are block diagrams of an exemplary computing system environment suitable for use in implementing the present invention.

Referring initially to FIG. 1A in particular, an exemplary operating environment for implementing the present invention is shown and designated generally as computing device 100. Computing device 100 is but one example of a suitable computing environment and is not intended to suggest any limitation as to the scope of use or functionality of the invention. Neither should the computing-environment 100 be interpreted as having any dependency or requirement relating to any one or combination of components illustrated.

The invention may be described in the general context of computer code or machine-usable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including hand-held devices, consumer electronics, general-purpose computers, specialty computing devices (e.g., cameras and printers), etc. The invention may also be practiced in distributed computing environments where tasks are performed by remote-processing devices that are linked through a communications network.

With reference to FIG. 1A, computing device 100 includes a bus 110 that directly or indirectly couples the following elements: memory 112, a central processing unit (CPU) 114, one or more presentation components 116, input/output ports 118, input/output components 120, an illustrative power supply 122 and a graphics processing unit (GPU) 124. Bus 110 represents what may be one or more busses (such as an address bus, data bus, or combination thereof). Although the various blocks of FIG. 1A are shown with lines for the sake of clarity, in reality, delineating various components is not so clear, and metaphorically, the lines would more accurately be gray and fuzzy. For example, one may consider a presentation component such as a display device to be an I/O component. Also, CPUs and GPUs have memory. The diagram of FIG. 1A is merely illustrative of an exemplary computing device that can be used in connection with one or more embodiments of the present invention. Distinction is not made between such categories as "workstation," "server," "laptop," "hand-held device," etc., as all are contemplated within the scope of FIG. 1A and reference to "computing device."

Computing device 100 typically includes a variety of computer-readable media. By way of example, and not limitation, computer-readable media may comprise Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices, or any other medium that can be used to encode desired information and be accessed by computing device 100.

Memory 112 includes computer-storage media in the form of volatile and/or nonvolatile memory. The memory may be removable, nonremovable, or a combination thereof. Exemplary hardware devices include solid-state memory, hard drives, optical-disc drives, etc. Computing device 100 includes one or more processors 114 that read data from various entities such as memory 112 or I/O components 120. Presentation component(s) 116 present data indications to a user or other device. Exemplary presentation components include a display device, speaker, printing component, vibrating component, etc.

I/O ports 118 allow computing device 100 to be logically coupled to other devices including I/O components 120, some of which may be built in. Illustrative components include a microphone, joystick, game pad, satellite dish, scanner, printer, wireless device, etc.

Figure 1B:
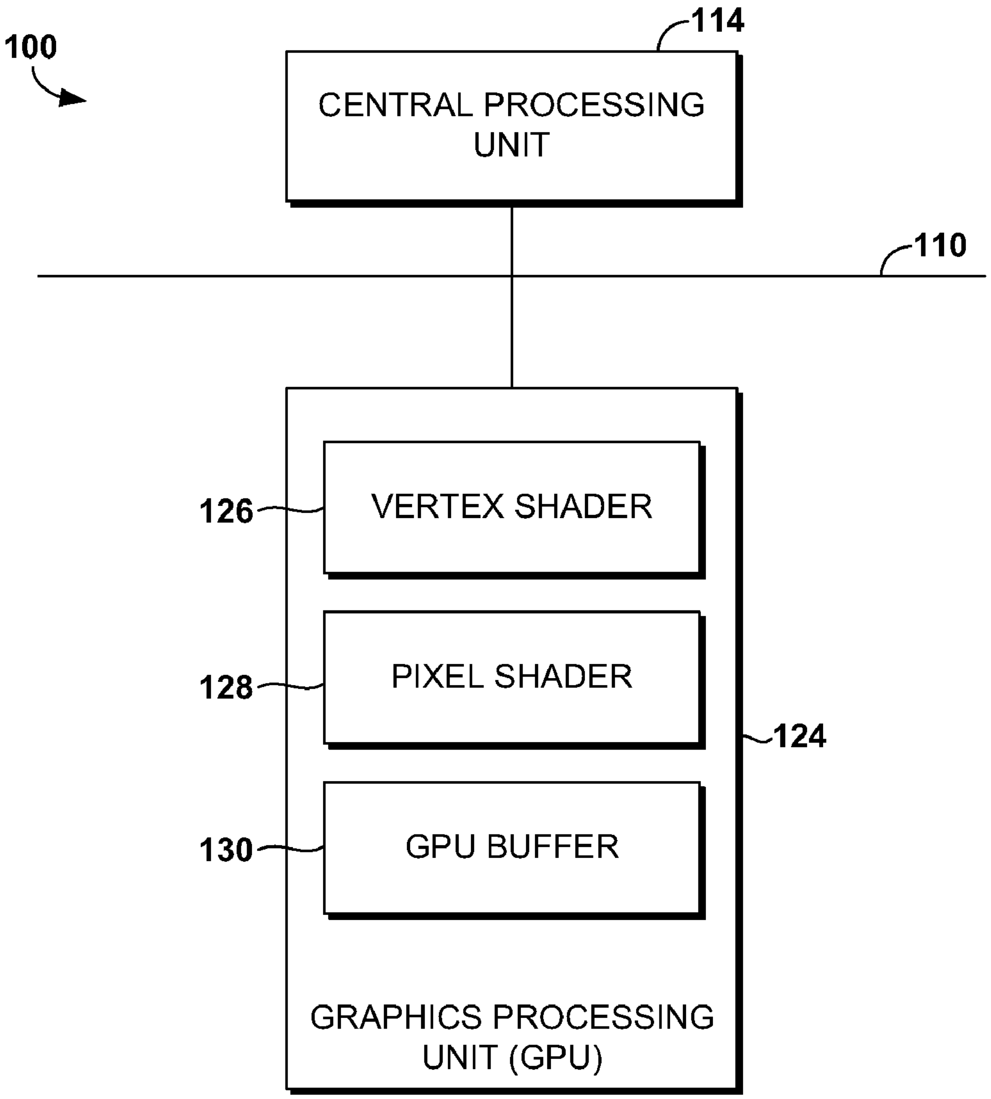

FIG. 1B details components of the computing device 100 that may be used for processing a glyph and rendering text. For example, the computing device 100 may be used to implement a text pipeline to render text. As known to those skilled in the art, rasterizing, merging, filtering, and blending relate to a series of operations that are performed on a glyph to render text. These operations and pipelines have not been as efficient at processing glyphs, and have failed to take advantage of available hardware. Embodiments of the present invention use the available hardware in a more efficient manner to increase the efficiency of the text pipeline.

Some of the GPU 124 hardware includes one or more procedural shaders. Procedural shaders are specialized processing subunits of the GPU 124 for performing specialized operations on graphics data. An example of a procedural shader is a vertex shader 126, which generally operates on vertices. For instance, the vertex shader 126 can apply computations of positions, colors and texturing coordinates to individual vertices. The vertex shader 126 may perform either fixed or programmable function computations on streams of vertices specified in the memory of the graphics pipeline. Another example of a procedural shader is a pixel shader 128. For instance, the outputs of the vertex shader 126 can be passed to the pixel shader 128, which in turn operates on each individual pixel. After a procedural shader concludes its operations, the information is placed in a GPU buffer 130, which may be presented on an attached display device or may be sent back to the host for further operation.

The GPU buffer 130 provides a storage location on the GPU 124 as a staging surface or scratch surface for glyph textures. As various rendering operations are performed with respect to a glyph texture, the glyph may be accessed from the GPU buffer 130, altered and re-stored on the buffer 130. As known to those skilled in the art, the GPU buffer 130 allows the glyph being processed to remain on the GPU 124 while it is transformed by a text pipeline. As it is time-consuming to transfer a glyph from the GPU 124 to the memory 112, it may be preferable for a glyph texture or bitmap to remain on the GPU buffer 130.

With respect to the pixel shader 128, specialized pixel shading functionality can be achieved by downloading instructions to the pixel shader 128. For instance, downloaded instructions may enable specialized merging, filtering, or averaging of the glyph texture. Furthermore, the functionality of many different operations may be provided by instruction sets tailored to the pixel shader 128. The ability to program the pixel shader 128 is advantageous for text rendering operations, and specialized sets of instructions may add value by easing development and improving performance. By executing these instructions, a variety of functions can be performed by the pixel shader 128, assuming the instruction count limit and other hardware limitations of the pixel shader 128 are not exceeded.

Figure 2:
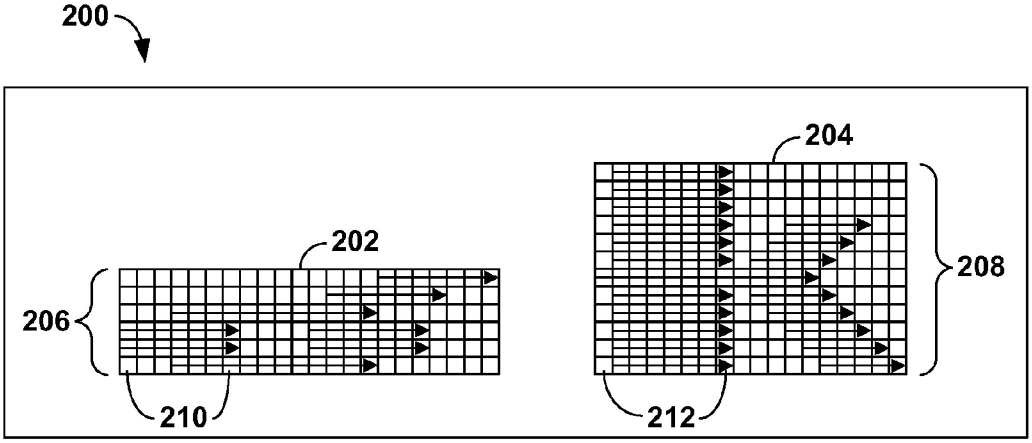
FIG. 2 illustrates an exemplary representation of a compressed glyph bitmap for the script character "o" and the script character "k"

FIG. 2 illustrates a representation of compressed glyph bitmaps 200 for the script font "ok". The "o" character or compressed glyph bitmap 202 is represented with a plurality of rows of data 206. The "k' character or compressed glyph bitmap 204 is represented with a plurality of rows of data 208. Specifically, the figure illustrates run length encoded glyph bitmaps 202, 204. The run length encoded compression technique includes replacing a series of repeating data points in a row with a compression code, a single data points, and a value that represents the number of times the data points is repeated. Run length encoding is one of many compression techniques that may be used to generate the compressed bitmap, and one skilled in the art could substitute other compression techniques for the run length encoding compression technique. Alternatively, the bitmap may be passed through in an uncompressed format avoiding the use of any compression technique.

FIG. 2 also illustrates the glyph bitmaps overscaled in the horizontal direction. The plurality of rows of data 206, 208 include multiple data points or texels that are overscaled horizontally. For example, texels in the "o" glyph bitmap are represented by a plurality of data points 210. Texels in the "k" glyph bitmap are represented by a plurality of data points 212. Specifically, the bitmaps 202 and 204 are overscaled by a factor of six to one. This six to one scaling is typically used for smaller text but may be used on larger text. However, larger size text is typically overscaled in both the horizontal and vertical direction as will be discussed in more detail below. One skilled in the art would appreciate that any scaling factor may be used in the horizontal direction, vertical direction, or both directions. In short, embodiments of the present invention are not limited to a specific scaling factor or direction. Additionally, the compressed glyph bitmaps created by the CPU typically have a color depth of 1 bit-per-pixel monochrome format but may also include other formats, such as 32 bit-per-pixel color data.

Figure 3A:
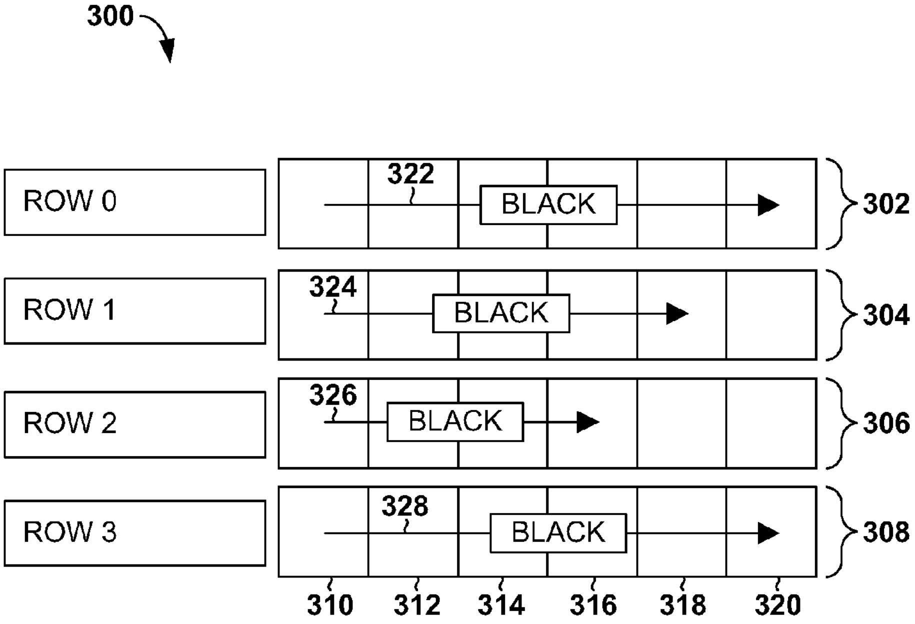
FIG. 3A illustrates a first way of drawing rows of data in a monochrome format and FIG. 3B illustrates a second way of drawing rows of data using a horizontal color packing format in accordance with one embodiment of the present invention.
Figure 3B:
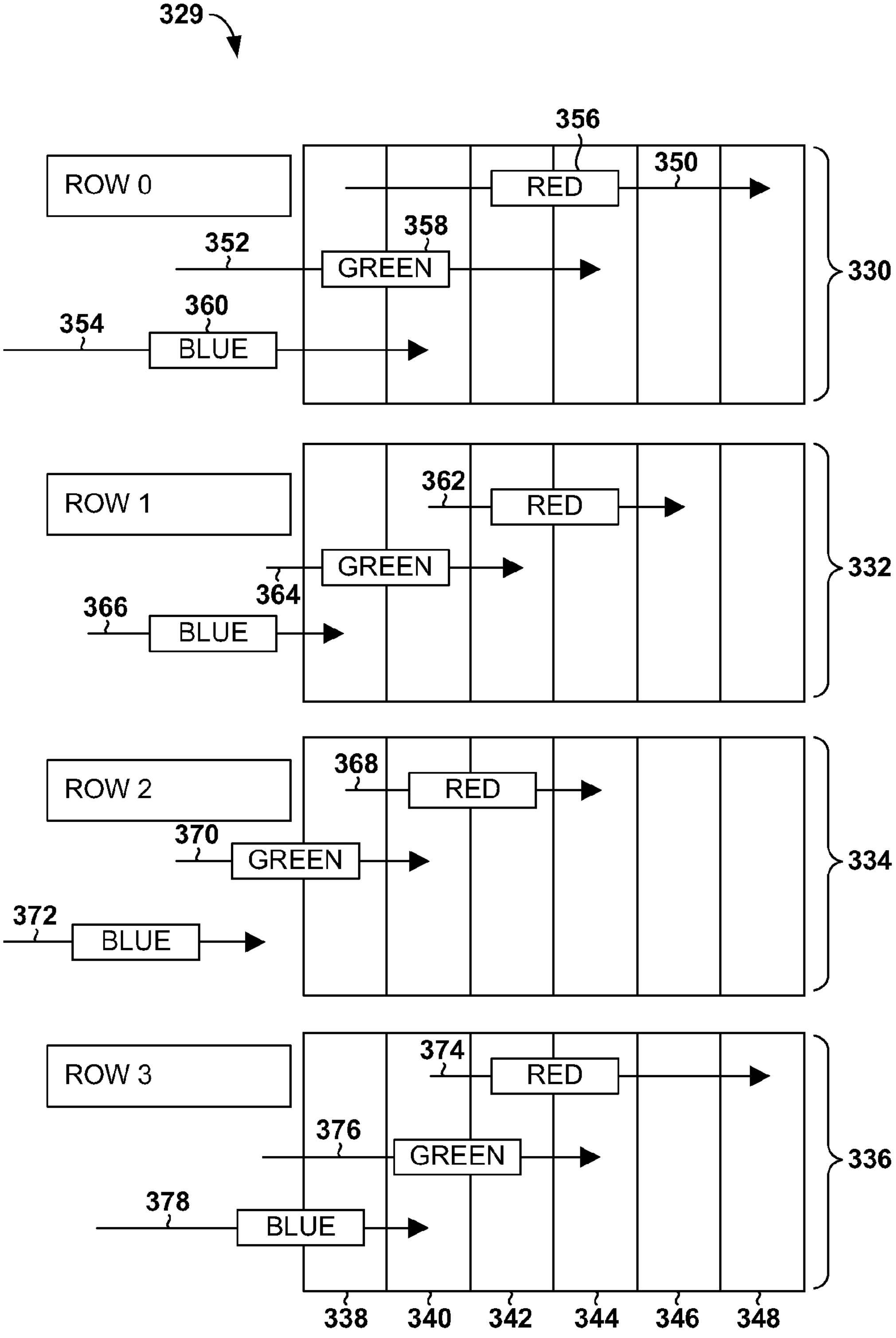

FIGS. 3A and 3B illustrate ways of drawing or populating row of data into a glyph texture from a compressed glyph bitmap. FIG. 3A illustrates a first way of drawing rows of data in a monochrome format. FIG. 3B illustrates a second way of drawing rows of data using a horizontal color packing format in accordance with one embodiment of the present invention.

The glyph texture 300 in FIG. 3A is illustrated with multiple rows of data 302, 304, 306, 308. In the figure, each row includes six pixels or texels. For example, row 308 includes texels or data points 310, 312, 314, 316, 318, and 320. Each data point includes either a black or white value and the black values are represented by rows of data 322, 324, 326, and 328. In the glyph texture illustrated in FIG. 3A, row 302 includes six black data points 322 and zero white data points. Likewise, row 304 includes four black data points 324 and two white data points; row 306 includes four black data points 326 and two white data points; and row 308 includes five black data points 328 and one white data points. Referring to FIG. 2 and FIG. 3A, rows 302, 304, 306, and 308 are representative of a portion of either rows 206 or 208 once they are drawn or populated into glyph texture 300.

FIG. 3B illustrates an improved way of drawing or populating rows of data in a glyph texture 329 using a horizontal color packing format in accordance with one embodiment of the present invention. Each single row of data 330, 332, 334, 336 are similar to the rows of data in FIG. 3A except that each row includes multiple color channels or sub-rows of color data. As with the rows in FIG. 3A, each of these rows include six pixels or texels. For example, row 336 includes texels or data points 338, 340, 342, 344, 346, and 348.

FIG. 3B illustrates horizontal color packing for four different rows 330, 332, 334, and 336. The process of horizontal color packing includes duplicating each row data from the compressed glyph bitmap 200 three times to create three rows of duplicated color data. For example, in single row 330, the three rows of duplicated data include rows 350, 352, and 354. The first row of duplicated data 358 is drawn in a first color 358 in the first sub-row of color data of the glyphs texture 329. The second row of duplicated data 350 is drawn in a second color 356 in the second sub-row of color data and is offset from the first color row 352 in a first direction. The third row of duplicated data 354 is drawn in a third color 360 and is offset from the first color row 352 in a second direction that is opposite the first direction. In the example illustrated in FIG. 3B, the first color row 352 is drawn in the green channel, the second color 350 row is drawn in the red channel, and the third color row 354 is drawn in the blue channel. This process is repeated with each row of data from the glyph bitmap until all of the rows of data are packed into subsequent row in the glyph texture. For example, FIG. 3B illustrates glyph row 332 color packed or populated with duplicated rows of data 362, 364, and 366 from the glyph bitmap. Likewise, glyph row 334 is color packed or populated with duplicated rows of data 368, 370, 372 and glyph row 336 is color packed or populated with duplicated rows of data 374, 376, 378 from the glyph bitmap.

As with the glyph rows in FIG. 3A the rows in FIG. 3B are additionally referenced as row 0, row 1, row 2, and row 3. Comparing FIGS. 3A and 3B, the red channel 356 for row 0 or row 330 is illustrated in FIG. 3B with a red value 350 for six pixel or texels. This is compared to row 0 or row 302 in FIG. 3A that is illustrated with a black value 322 for six pixels. Similarly, row 1 or row 332 of FIG. 3B is illustrated with a red value 362 for four pixels or texels compared to row 1 or row 304 in FIG. 3A that is illustrated with a black value 324 for four pixels. Likewise, row 2 or row 334 of FIG. 3B is illustrated with a red value 368 for four pixels or texels compared to row 2 or row 306 in FIG. 3A that is illustrated with a black value 326 for four pixels. Finally, row 3 or row 336 of FIG. 3B is illustrated with a red value 374 for five pixels or texels compared to row 3 or row 308 in FIG. 3A that is illustrated with a black value 328 for five pixels. Thus, the horizontal color packing method illustrated in FIG. 3B is storing the same data points in FIG. 3A just in an improved processing format.

In sum, FIG. 3B illustrates horizontal color packing which is an alternative to the scheme illustrated in FIG. 3A. Specifically, the horizontal color packing example of FIG. 3B illustrates compressing six pixels of data from the compressed glyph bitmap 200 into six pixels of color data for a plurality of rows. As will be discussed in more detail below, the horizontal color packing method enables the filtering step to be completed with less samples than the method stored in FIG. 3A. Additionally, one skilled in the art would appreciate that the color packing method illustrated in FIG. 3B is not limited to compressing only six pixels into four row of a glyph. And any number of pixels may be compressed into any number of rows. However, embodiments of the present invention are optimized to work on four channels because the average human eye can recognize three color channels thereby providing one measure of transparency.

Figure 4A:
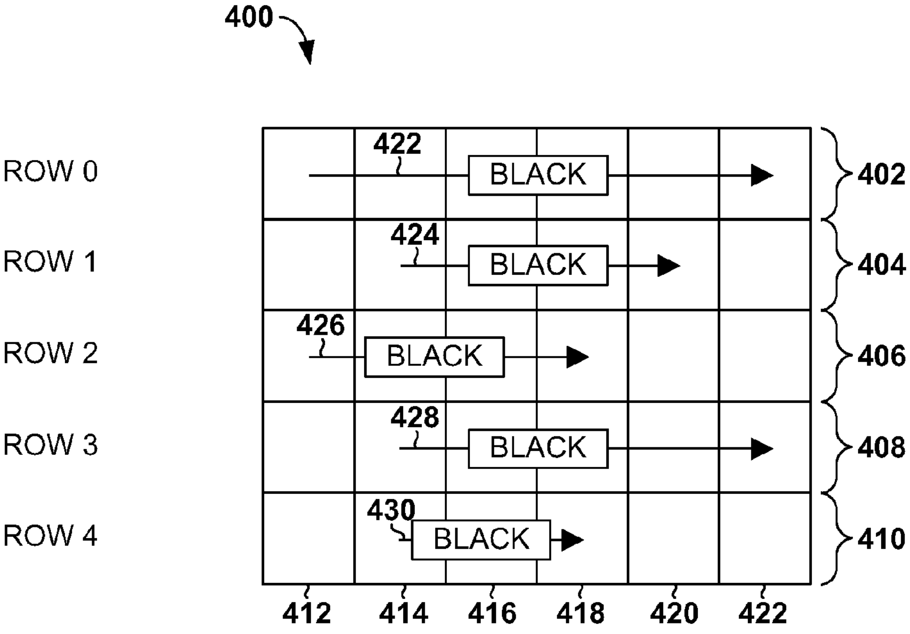
FIG. 4A illustrates a first way of drawing rows of data in a monochrome format and FIG. 4B illustrates a second way of drawing rows of data using a vertical color packing format in accordance with one embodiment of the present invention.
Figure 4B:
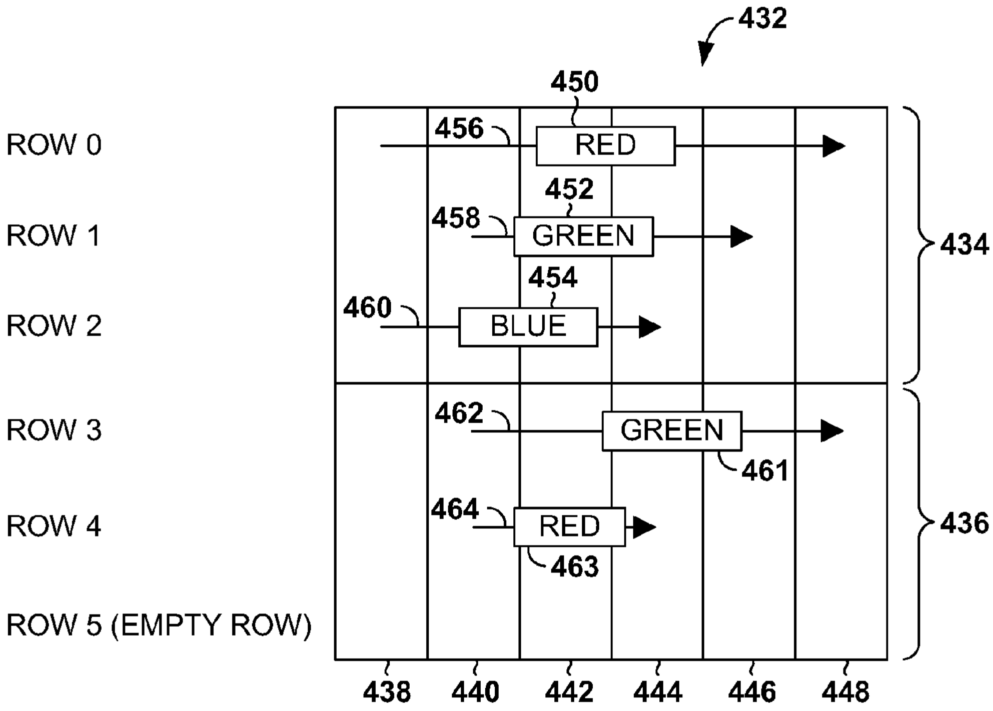

FIGS. 4A and 4B illustrates ways of drawing or populating row of data into a glyph texture from a compressed glyph bitmap. The figures illustrate a glyph texture overscaled in both the horizontal and vertical direction. Specifically, the figures illustrate a texture overscaled by a factor of six in the horizontal direction and a factor of five in the vertical direction. FIG. 4A illustrates a first way of drawing rows of data in a monochrome format and FIG. 4B illustrates a second way of drawing rows of data using a vertical color packing format in accordance with one embodiment of the present invention.

The glyph texture 400 in FIG. 4A is illustrated with multiple rows of data 402, 404, 406, 408, 410. In the figure, each row includes six pixels or texels for a total of 30 pixels or texels illustrated in the glyph texture 400. For example, row 410 includes texels or data points 412, 414, 416, 418, 420, and 422. Each data point includes either a black or white value and the black values are represented by rows of data 422, 424, 426, 428, and 430. In the glyph texture illustrated in FIG. 4A, row 402 includes six black data points 422 and zero white data points. Likewise, row 404 includes four black data points 424 and two white data points; row 406 includes four black data points 426 and two white data points; row 408 includes five black data points 428 and one white data points; and row 410 includes three black data points 430 and one white data points. Referring to FIG. 2 and FIG. 4A, glyph texture 400 represents a portion of rows 206 or 208 drawn overscaled and populated into glyph texture 400.

FIG. 4B illustrates an improved way of drawing or populating rows of data in a glyph texture 432 using a vertical color packing format in accordance with one embodiment of the present invention. Each single row of data 434 and 436 are similar to the rows of data in FIG. 4A except that each row includes multiple color channels or sub-rows of color data. For example, each pixel in row 434 may have a red channel 450, a green channel 452, and a blue channel 454. One skilled in the art would appreciate that each pixel in each row may have a plurality of channels which may also include an alpha channel. As with the rows in FIG. 4A, each of the rows in the glyph texture 432 is illustrated with six pixels or texels. For example, row 436 includes texels or data points 438, 440, 442, 444, 446, 448.

FIG. 4B illustrates vertical color packing five rows of data from the glyphs bitmap 200 in to two rows of data 434, 436 in the glyph texture 432. The illustrated example of vertical color packing illustrates the first row of data from the compressed glyph bitmap drawn in the red channel 450 of the first row 434 and is represented by data row 456. The second row of data from the compressed glyph bitmap is drawn in the green channel 452 of the first row 434 and is represented by data row 458. Likewise, the third row of data from the compressed glyph map is drawn in the blue channel 454 of the first row 434 and is represented by data row 460. In this example, this odd numbered row 434 is considered packed when three of the channels for each texel are populated with data and the method or system would move to the next row after these channels were packed.

Thus, the fourth row of data from the compressed glyph bitmap is drawn in the green channel 461 of the second row 436 and is represented by data row 462. Likewise, the fifth row of data from the compressed glyph map is drawn in the red channel 463 of the second row 436 and is represented by data row 464. In this example, this even numbered row 436 is considered packed when two of the channels for each texel are populated with data. The method or system would move to the next row after the two channels were populated. Populating three channels in odd number rows and two channels in even number row would continue until the data from the glyph bitmap is vertically color packed into the glyph texture. One skilled in the art would appreciate that this odd and even number row progression is only one embodiment of the present invention and any combination of channel packing with row progression may be used. In sum, FIG. 4B illustrates one specific embodiment of color packing 30 pixels or texels of data from the glyph bitmap into 12 pixels or texels of data into the glyph texture 432.

As with the glyph rows in FIG. 4A the rows in FIG. 4B are additionally referenced as row 0, row 1, row 2, row 3, and row 4. Comparing FIGS. 4A and 4B, the red channel 450 for row 0 of row 434 is illustrated in FIG. 4B with a red value 456 for six pixel or texels. This is compared to row 0 or row 402 in FIG. 4A that is illustrated with a black value 422 for six pixels. Similarly, row 1 of row 434 of FIG. 4B is illustrated with a green value 458 for four pixels or texels compared to row 1 or row 404 in FIG. 4A that is illustrated with a black value 424 for four pixels. Likewise, row 2 of row 434 of FIG. 4B is illustrated with a blue value 460 for four pixels or texels compared to row 2 or row 406 in FIG. 4A that is illustrated with a black value 426 for four pixels. Additionally, row 3 of row 436 of FIG. 4B, which is the next row in the glyph texture 432, is illustrated with a green value 462 for five pixels or texels compared to row 3 or row 408 in FIG. 4A that is illustrated with a black value 428 for five pixels. Finally, row 4 of row 436 of FIG. 4B is illustrated with a red value 464 for five pixels or texels compared to row 4 or row 410 in FIG. 4A that is illustrated with a black value 430 for five pixels. Thus, the vertical color packing method illustrated in FIG. 4B is storing the same data points in FIG. 4A just in an improved processing format.

In sum, FIG. 4B illustrates vertical color packing which is an alternative to the scheme illustrated in FIG. 4A. Specifically, the vertical color packing example of FIG. 4B illustrates compressing thirty pixels of data from the compressed glyph bitmap 200 into twelve pixels of color data. As will be discussed in more detail below, the vertical color packing method enables the filtering step to be completed with less samples than values stored in FIG. 4A. Additionally, one skilled in the art would appreciate that the color packing method illustrated in FIG. 4B is not limited to compressing thirty pixels of data into two row of a glyph texture. And any number of pixels may be compressed into any number of rows.

Figure 5:
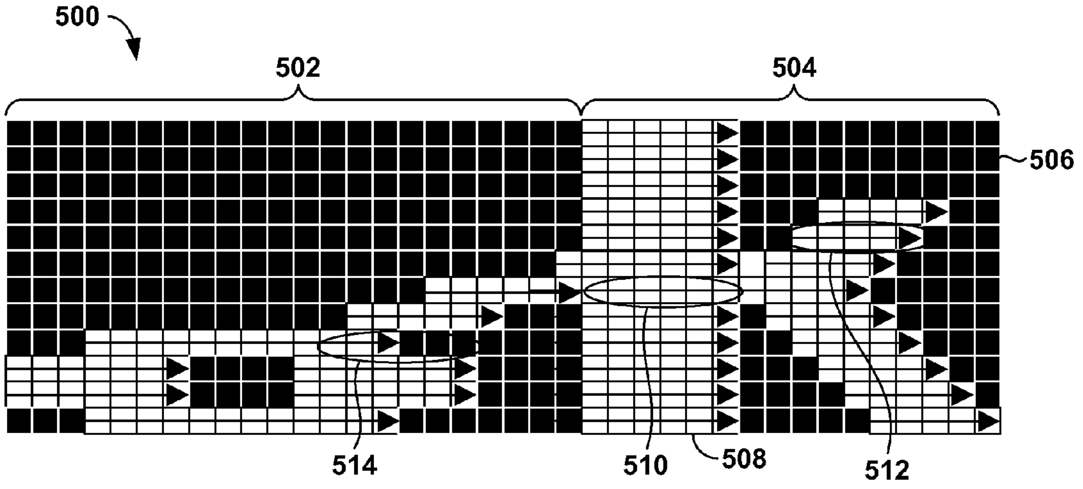
FIG. 5 illustrates a representation of a merged texture for a scripted "ok" in accordance with one embodiment of the present invention.

FIG. 5 illustrates a representation of a merged texture for a scripted "ok" in accordance with one embodiment of the present invention. Specifically, FIG. 5 illustrates merging a plurality of glyph textures (e.g., 432) into a merged texture 500 to identify overlapping color rows. In FIG. 5, the "o" glyph texture 502 is shown merged with the "k" glyph texture 504 to form a merged texture 500. The merged texture 500 is created by first clearing the merged texture surface to transparent black. An example of a transparent black surface is illustrated by pixel or texel 506. The rows of data (e.g., 434, 436) from the plurality of glyph textures are transferred to the merged texture 500. Each pixel of the merged texture that is covered by one or more rows of data is lit. An example of a lit pixel is illustrated by pixel or texel 508. The vertices are rendered using a pixel shader that outputs opaque colors for each lit pixel. The result of the merging operation is that the merged texture or surface 500 will be opaque on any pixel or texel that is covered by the data. The merged texture 500 may then be filtered as discussed in more detail below.

Figure 6:
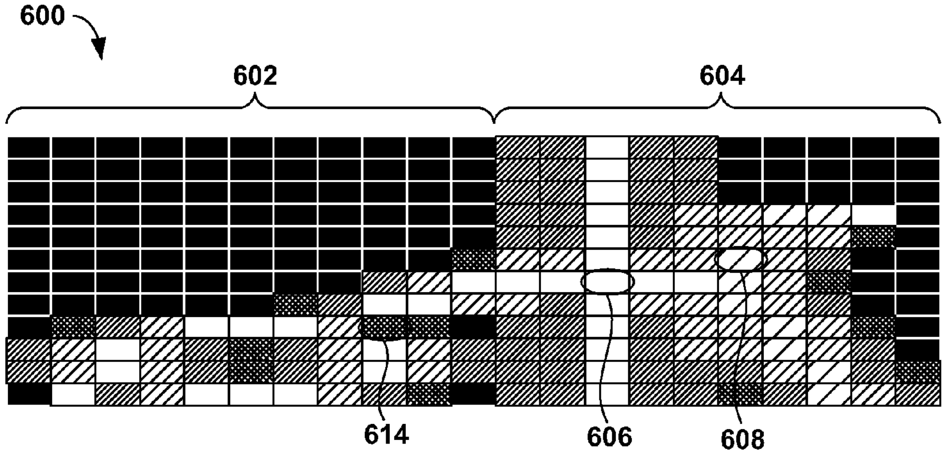
FIG. 6 illustrates a representation of a grayscale texture for a scripted "ok" in accordance with one embodiment of the present invention.

FIG. 6 illustrates a filtered grayscale texture 600 for the "ok" scripted merged texture 500. The merged texture in FIG. 5 was overscaled in the horizontal direction by a factor of six. Example of overscaling by this factor is illustrated by the texels encircled by ovals 510, 512, 514 in FIG. 5. Again, the merged texture in 500 illustrates overscaling in the horizontal direction and does not illustrate overscaling in the vertical direction as illustrated by FIG. 4B. However, one skilled in the art would appreciate that the merged texture 500 may be overscaled in either or both directions.

FIG. 6 further illustrates the filtered results of the grayscale texture for the merged texture 500. Specifically, the grayscale texture 600 illustrates the "o" merged glyphs 602 and the "k' merged glyphs 604 after filtering. For example, the filtered six pixels in oval 510 are illustrated by a single grayscale pixel 606. Likewise, the filtered six pixels in oval 512 are illustrated by a single grayscale pixel 608 and the filtered six pixels in oval 514 are illustrated by a single grayscale pixel 614. The filtering process for a horizontal color packed glyph and a vertical color packed glyph will be discussed in more detail below.

Figure 7:
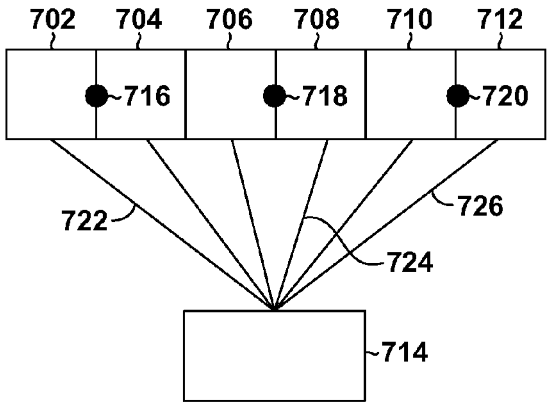
FIG. 7 illustrates a filtering process for a plurality of pixels in accordance with one embodiment of the present invention.

FIG. 7 illustrates one method for filtering six pixels to display a grayscale texture. The figure illustrates six pixels 702, 704, 706, 708, 710, 712 that are filtered or sampled to create a single grayscale pixel 714. In this filtering process example, a bilinear filter is applied to the six pixels and then the resulting values are averaged. Specifically, a bilinear filter is applied to pixels 702 and 704 as illustrated by filter point 716. Likewise, a bilinear filter is applied to pixels 706 and 708 as illustrated by filter point 718 and a bilinear filter is applied to pixels 710 and 712 as illustrated by filter point 720. These filter values are averaged as illustrated by lines 722, 724, and 726 to calculate a grayscale coverage.

Figure 8A:
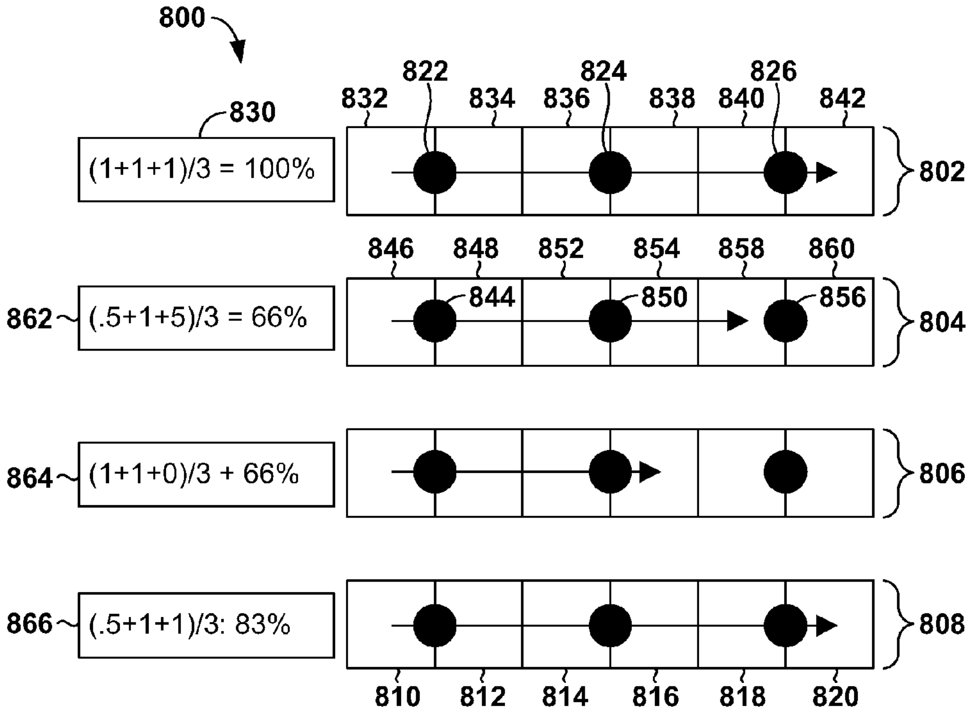
FIG. 8A illustrates a filtering process performed on rows of data drawn in a monochrome format and FIG. 8B illustrates a filtering process performed on rows of data drawn in a horizontal color packing format in accordance with one embodiment of the present invention.

As stated, this is one method of averaging six pixels and it required taking three samples to obtain one grayscale texture. FIG. 8A illustrates this filtering process performed on rows of data drawn in a monochrome format. The glyph texture 800 is the same glyph texture 300 illustrated in FIG. 3A. As before, the glyph texture 800 illustrates four rows of data 802, 804, 806, 808 with each row having six pixels. For example, row 808 includes pixels 810, 812, 814, 816, 818, 820. Each row of data illustrated in FIG. 8A may be represented by the six pixels in FIG. 7.

As explained with regards to the six pixels in FIG. 7, to filter each row of data requires taking three samples. For example, in row 802 the bilinear filter points of 822, 824, 826 would obtain three values which are averaged to calculate a grayscale coverage value. Specifically, box 830 shows the coverage values for the six pixels as calculated by averaging the bilinear filter results. As illustrated in FIG. 8A, the coverage values for the six pixels in row 802 is a 100% as shown in box 830. This number is obtained from averaging the bilinear sample values of: one between pixels 832 and 834, one between pixels 836 and 838, and one between pixels 840 and 842. Similarly, the coverage value for the six pixels in row 804 is 66% as shown in box 862. This number is obtained from averaging the bilinear sample values of: one-half between pixels 846 and 848, one between pixels 850 and 854, and one between pixels 858 and 860. Likewise, the coverage values for rows 806 and 808 are shown in boxes 864 and 866, respectively. In sum, to obtain the gray scale coverage value for six pixels requires three samples.

Figure 8B:
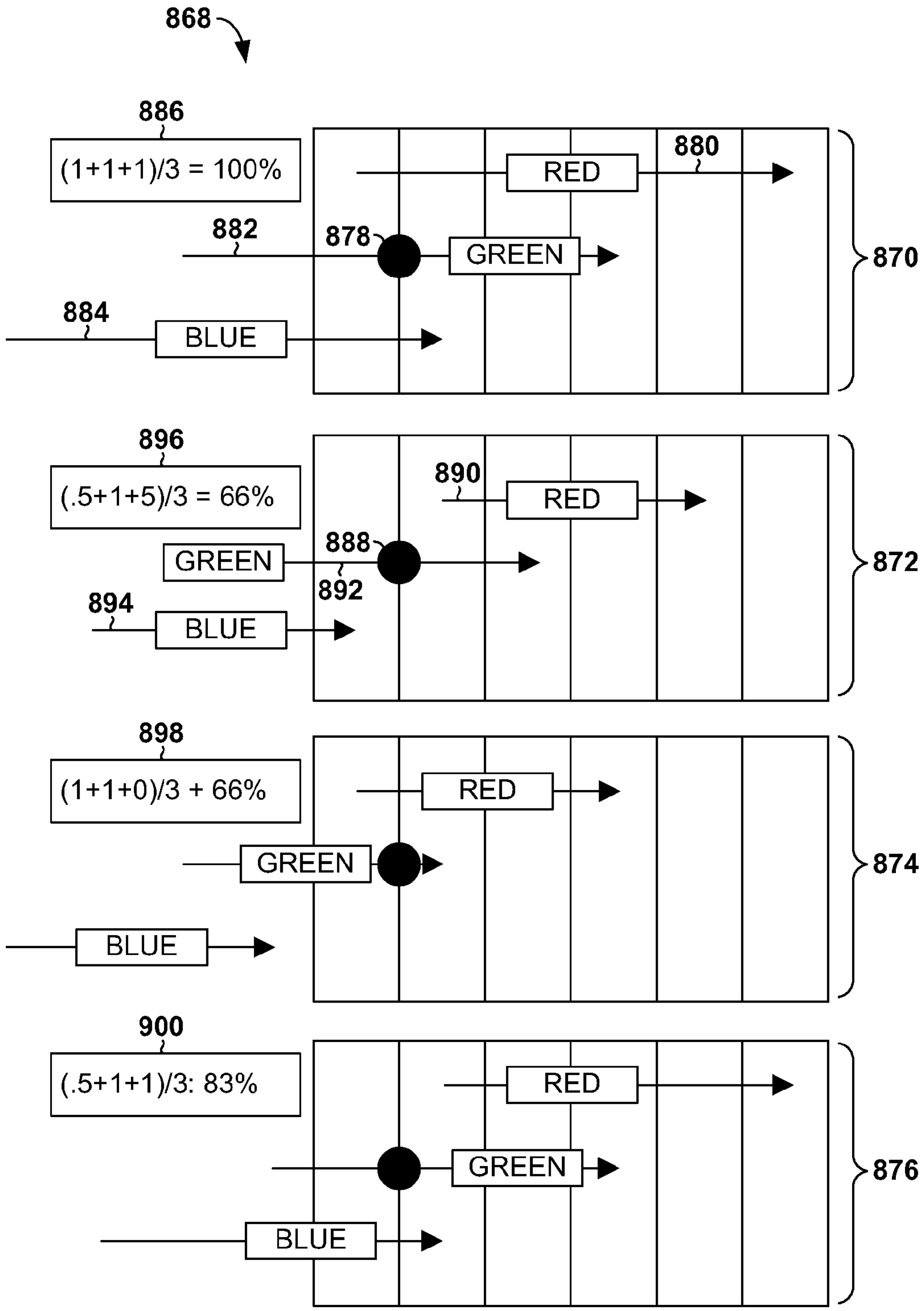

FIG. 8B illustrates a filtering process performed on rows of data drawn in a horizontal color packing format in accordance with one embodiment of the present invention. The glyph texture 868 is the same glyph texture 329 illustrated data in FIG. 3B. As before, the glyph texture 868 illustrates four rows of data 870, 872, 874, 876 with each row having six pixels. However, unlike the three samples required in FIG. 8A, the illustrated horizontal color packing method only requires one sample to obtain the same coverage value obtained in FIG. 8A.

For example, referring to row 870, the bilinear filter point 878 would calculate a 100% coverage value by taking one sample. Specifically, the bilinear filter 878 as applied would obtain a value of: one for the red channel 880, one for the green channel 882, and one for the blue channel 884. These color channel values are averaged and the calculation is illustrated in box 886. Similarly, row 872 shows how a 66% coverage value is obtained with one sample. Specifically, the bilinear filter is applied at point 888 and returns a value of: one-half for the red channel 890, one for the green channel 892, and one-half for the blue channel 894. These color channel values are averaged and the calculation is illustrated in box 896. Likewise, box 898 and box 900 illustrate the coverage calculation for rows 874 and 876, respectively. In sum, the horizontal color packing method reduces the number of required samples to calculate the grayscale coverage value.

Again, embodiments of the present invention are not limited to the number of rows or data points illustrated in the specific examples and may include more or less rows and/or data points.

Figure 9A:
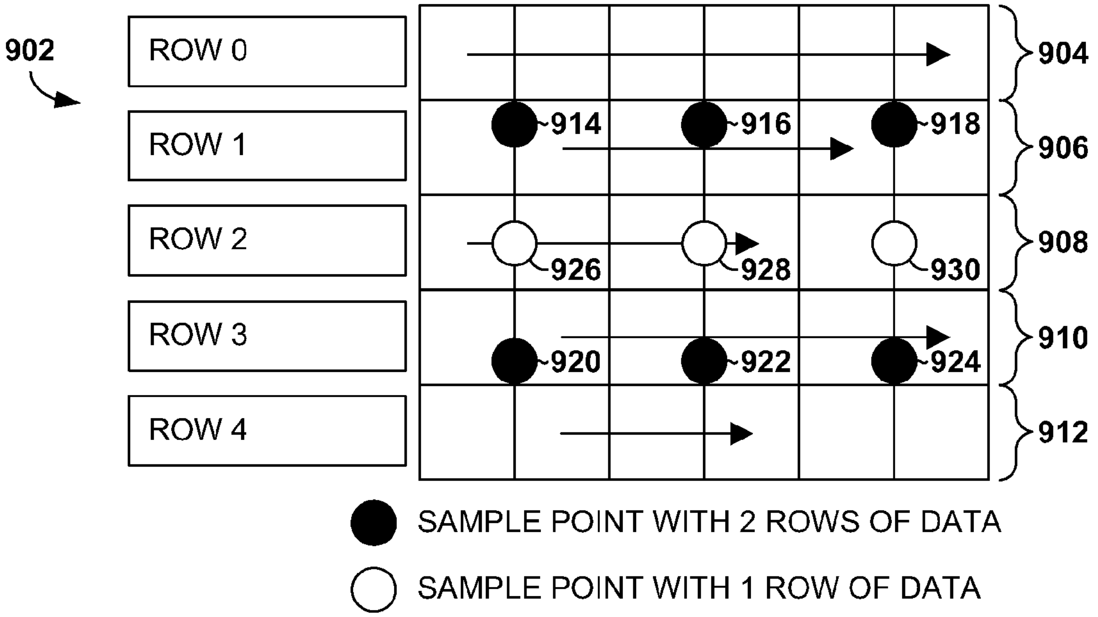
FIG. 9A illustrates a filtering process performed on rows of data drawn in a monochrome format and FIG. 9B illustrates a filtering process performed on rows of data drawn in a vertical color packing format in accordance with one embodiment of the present invention.

FIG. 9A illustrates a filtering process performed on rows of data drawn in a monochrome or grayscale format. The glyph texture 902 is the same glyph texture 400 illustrated in FIG. 4A. As before, the glyph texture 902 includes five rows of overscaled data 904, 906, 908, 910 and 912 with each row having six pixels. The figure shows taking nine samples to obtain a grayscale coverage value. Specifically, the nine sample points are illustrated by 914, 916, 918, 920, 922, 924, 926, 928, and 930. The first six sample points are applied between two rows of data and the last three sample points are applied to one row of data. In sum, to obtain the gray scale coverage value for six pixels requires three samples.

Figure 9B:
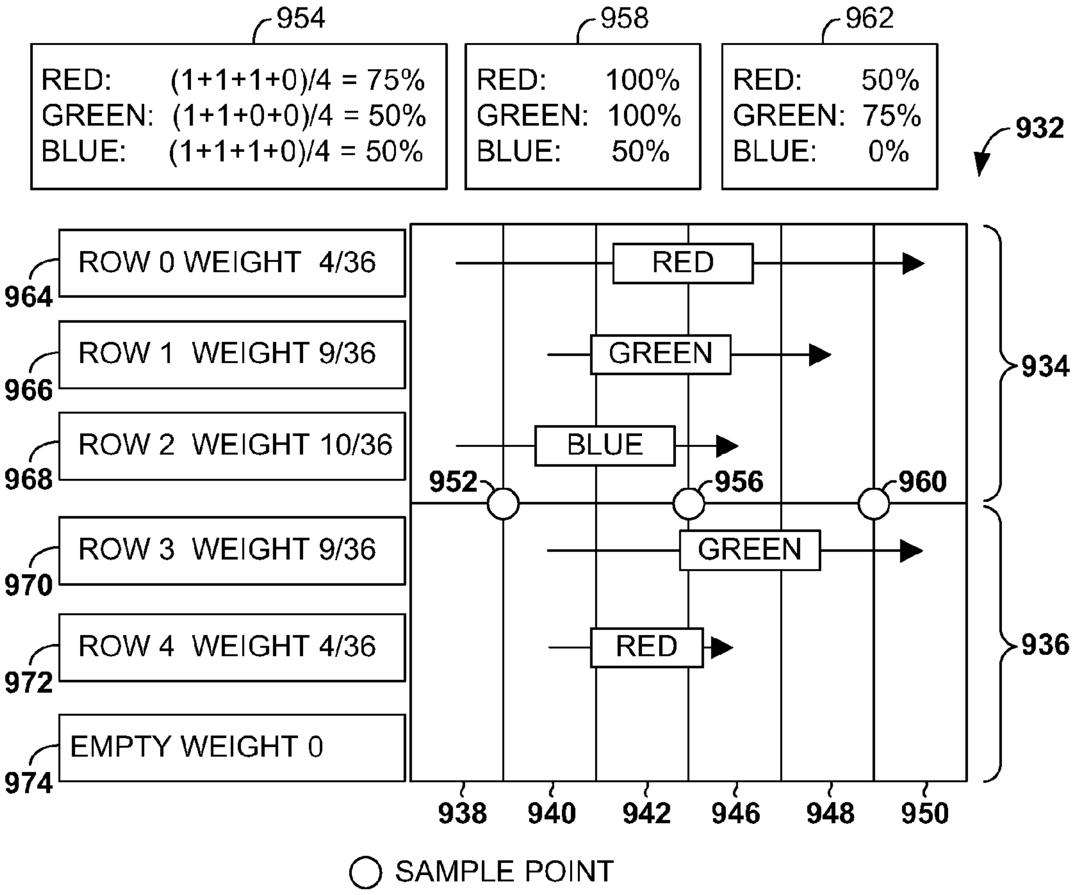

FIG. 9B illustrates a filtering process performed on rows of data drawn in a vertical color packing format in accordance with one embodiment of the present invention. The glyph texture 932 is the same glyph texture 400 illustrated in FIG. 4B. As before, the glyph texture 868 illustrates two rows of data 934 and 936 that have six pixels with multiple color channels. For example, row 936 includes pixels 938, 940, 942, 946, 948, 950 with each pixel having a red, green, blue sub-row or channel. However, unlike the nine samples required in FIG. 9A, the illustrated vertical color packing method only requires three sample to obtain the same coverage value.

Specifically, the three bilinear filter points are illustrated by 952, 956, and 960. The first filter point 952 obtains three value color values for each channel for the surrounding texel or pixels. For example, the red channel would return a value of 75%, the green channel would return a value of 50%, and the blue channel would return a value of 50% as illustrated in box 954. Likewise, a bilinear filter applied at 956 would obtain values for the red, green, and blue channels illustrated in box 958, and a bilinear filter applied at 960 would obtain the red, green, and blue channels values illustrated in box 962.

Additionally, a weighted factor could be applied to each of the color channels as illustrated by boxes 964 through 974. In one embodiment, the weighted average is a non-linear bell shaped weighted average. This bell shaped distribution is illustrated with the highest weighting factor in the middle 968, tapering out to lower weighting factors 966, 970, and further decreasing to a lower weighting factors 964, 972. Thus, the blue channel in this example will be weighted 10/36 and the red channel will be weighted 8/36 and the green channel would be weighted 18/36. Furthermore, once the bilinear filter is applied, each channel can be averaged to obtain the grayscale coverage value. Thus comparing FIG. 9B to FIG. 9A, the calculated coverage value is now obtained in three samples for the texture glyph in FIG. 9B versus nine sample for the texture glyph in FIG. 9A. Again, this is because the vertical color packing scheme enables compressing 30 pixels of data into 12 pixels of data.

Finally, once the gray scale texture 600 is rendered it may then be blended using sub-pixel rendering to further display the plurality of merged glyphs. Sub-pixel rendering is well known in the art and improves the readability of the characters by exploiting the pixel structure of an Liquid Crystal Display (LCD). Sub-pixel rendering is possible because each pixel in an LCD screen is composed of three sub-pixels. That is, one pixel on an LCD screen includes: one red, one green, and one blue (RGB) sub-pixel. To the human eye these sub-pixels appear as one pixel. However, each of these pixels is unique and may be controlled individually. Thus, by individually controlling the sub-pixels, the resolution of the LCD screen may be improved thereby increasing the readability of text displayed on existing LCD.

Figure 10:
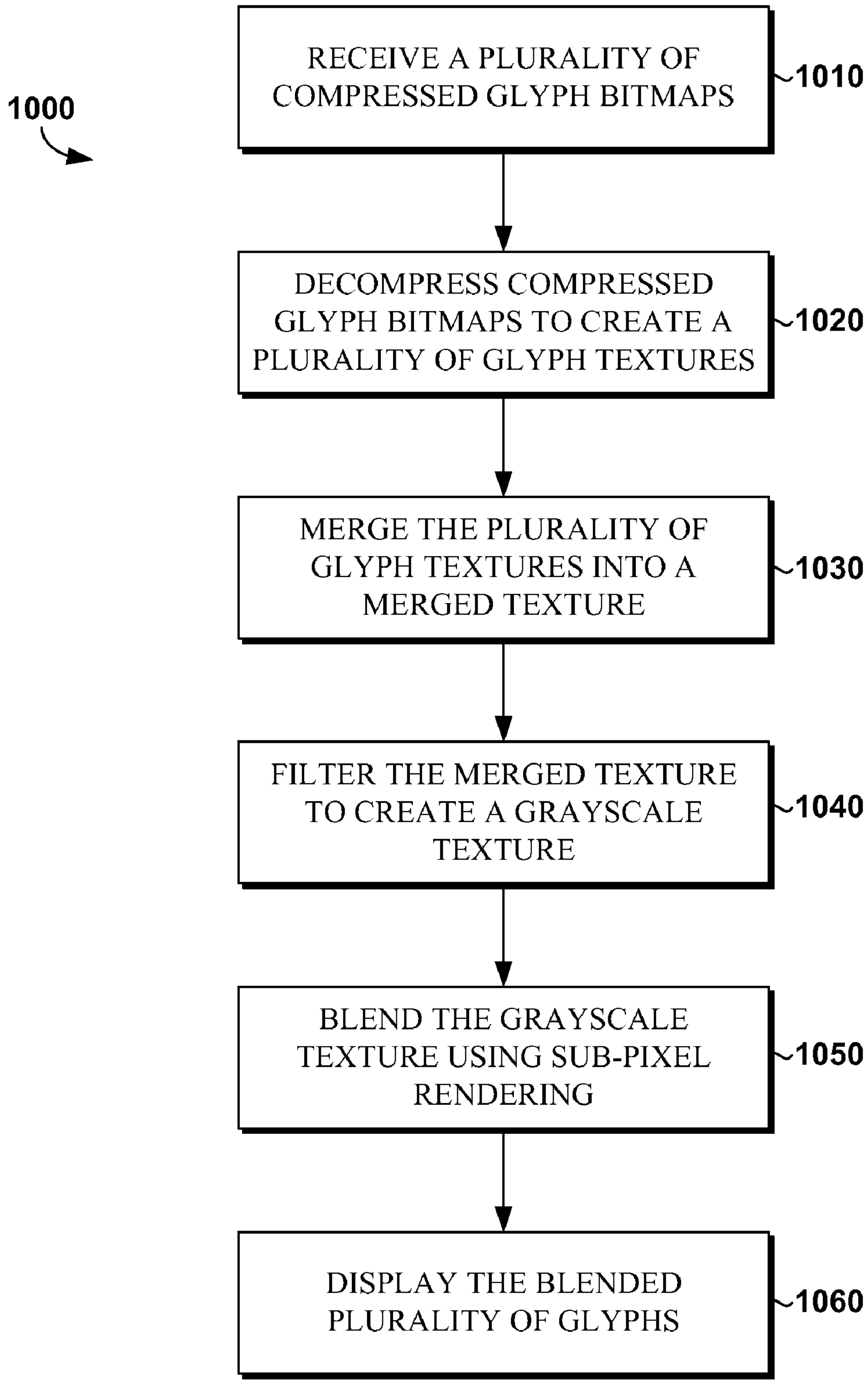
FIG. 10 illustrates a method in accordance with one embodiment of the present invention for merging, filtering, rendering, and blending glyphs with a GPU in accordance with one embodiment of the present invention.

FIG. 10 illustrates a method 1000 in accordance with one embodiment of the present invention for merging, filtering, rendering, and blending glyphs with a GPU in accordance with one embodiment of the present invention. At 1010, method 1000 receives a compressed glyph bitmap generated by a CPU or other processor. For example, the compressed glyph bitmap may include run length encoded compression scheme or any other compression scheme. An example of a run length encoded glyph bitmap is illustrated in FIG. 2 (item 200). The run-length encoded glyph bitmap 200 may include a first color depth. For example, the first color depth may include a 1 bit per pixel monochrome format or it may include any other color depth.

At 1020, the method 1000 decompresses the glyph bitmap to create a plurality of glyph textures. The glyph textures created in step 1020 may include a second color depth. For example, the second color depth may include a 32-bit-per-pixel red, green and blue format. The decompressing step may include packing a plurality of rows of data from the glyph bitmap into a single row of the glyph textures. As discussed, each row of the glyph texture includes sub-rows or channels of color data.

Additionally, the packing may include vertical color packing or horizontal color packing. In one embodiment of the present invention the color packing enables placing every five rows of data from the compressed glyph bitmap in to two rows of the glyph texture. In this example, 30 pixels of data from the compressed glyph bitmap were packed into 12 pixels of color data. This embodiment of color packing enabled the filtering to be completed with three samples. Likewise, one example of horizontal color packing enabled the compression of 6 pixels of data from the compressed glyph bitmap into 6 pixels of color data. This embodiment of color packing enabled the filtering to be completed in one sample.

At 1030, the method 1000 merges the plurality of glyph textures into a merge texture. For example, merge texture 500 in FIG. 5 illustrates the glyph texture "o" and the "k" texture merged into a single merge texture 500. As discussed, the merging the textures includes the steps of clearing the merged surface to transparent black as illustrated in FIG. 5; transferring the rows of data from the glyph textures to the merge texture; lighting each pixel covered by one or more rows of data in the merged texture; and rendering vertices using a pixel shader 128 that outputs opaque colors for each lighted pixel.

At 1040, the method 1000 filters the merge texture to create a grayscale texture based on a calculate coverage value. The filter may include a bilinear filter combined with a bell-shaped weighted average or any other linear or non-linear average. Again, embodiments of the present invention are not limited to the bilinear filter or the bell-shaped weighted average disclosed and may employ other filters or averaging techniques. Finally, at 1050 and 1060, the method 1000 may blend the grayscale texture using sub-pixel rendering and display the blended plurality. One example of sub-pixel rendering is ClearType filtering and is commonly known in the art.

Figure 11:
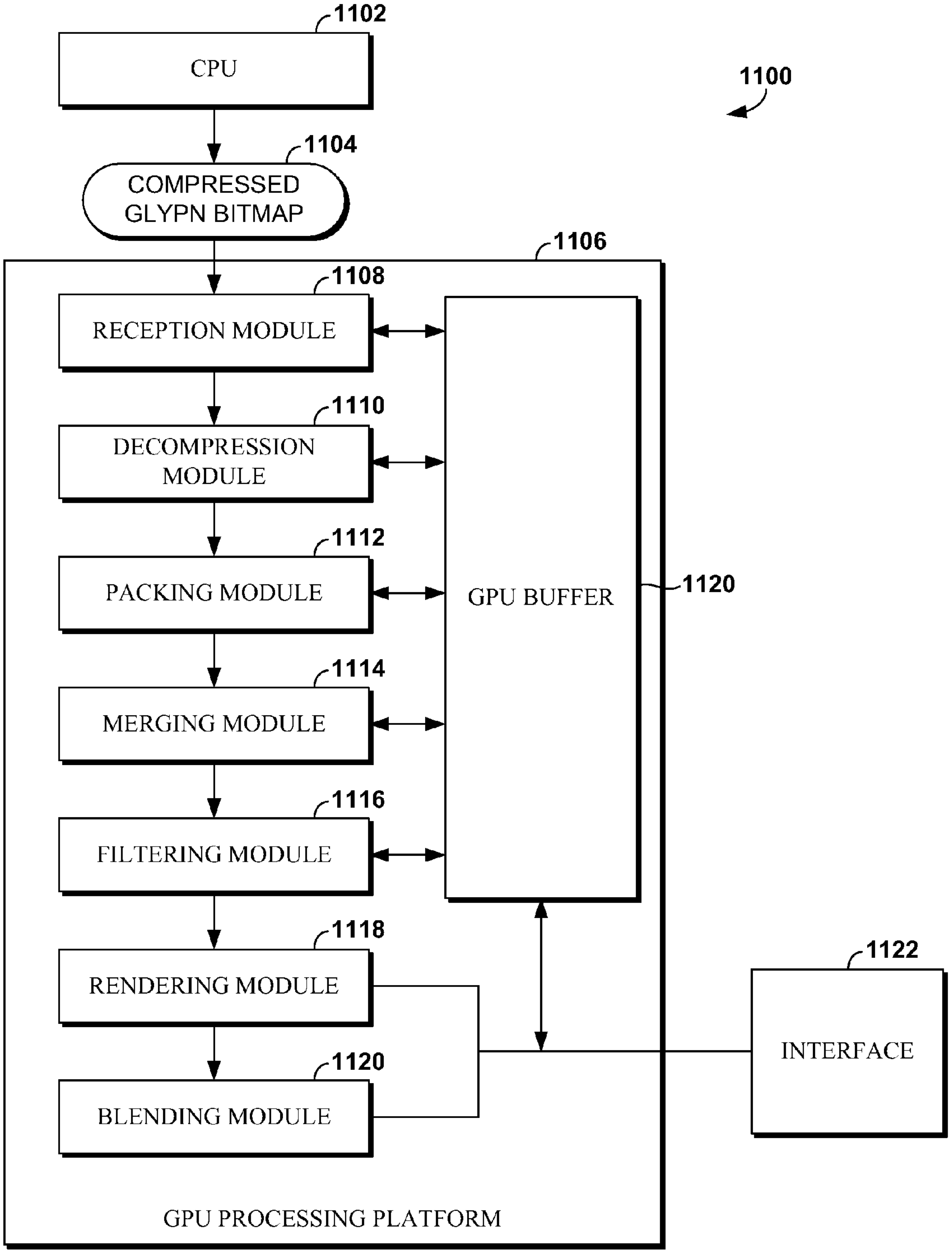
FIG. 11 is a schematic diagram illustrating a system for merging, filtering, rendering, and blending glyphs with a GPU in accordance with one embodiment of the present invention.

FIG. 11 is a schematic diagram illustrating a system for merging, filtering, rendering, and blending glyphs with a GPU in accordance with one embodiment of the present invention. The system may include a CPU 1102 or other processor, which introduces a compressed glyph bitmap 1104 to the GPU processing platform 1106. The GPU processing platform 1106 may enable performance of a variety of GPU operations with respect to the compressed glyph bitmap 1104.

For example, the compressed glyph bitmap may be received via reception module 1108 and decompressed via a decompression module 1110. The decompression module may create a plurality of glyph textures having a color depth that is different from the compressed glyph bitmap 1104.

GPU processing platform 1106 may also have a packing module 1112. The packing module may be configured to place a plurality of rows of data from the glyph bitmap 1104 into a single row of data of a glyph texture. Each single row of data in the glyph texture includes a plurality of sub-rows of color data as discussed above and illustrated in FIGS. 3B and 4B.

Additionally, GPU processing platform 1106 may include a merging module 1114. The merging module is configured to merge a plurality of glyph textures into a merge texture as discussed above and illustrated in FIG. 5. The GPU processing platform 1106 may also include a filtering module 1116. Filtering module 1116 is configured to filter the merge texture to create a grayscale texture. The grayscale texture may contain a plurality of merged glyph that may be rendered using rendering module 1118 and/or blending module 1120. The rendering module may be configured to render the grayscale texture to display the plurality of merge glyphs as shown in FIG. 6. The blending module may be further used to blend the grayscale texture using sub-pixel rendering as discussed above.

As the compressed glyph bitmap 1104 is processed by the GPU processing platform 1106, the compressed glyph bitmap and resulting textures may be stored in GPU buffer 1120. As various merging and filtering techniques are performed, the glyph textures may be accessed from the GPU buffer 1120, altered, and restored on the buffer 1120. Thus, the GPU buffer 1120 allows for the glyph textures to remain on the GPU while it is being transformed. In one embodiment, the GPU processing platform 1106 modifies the glyph textures non-destructively. In this case, the stored glyph textures in the GPU buffer 1120 reflect the various modifications of the glyph texture. To display the rendered grayscale texture or blended texture image processed by the GPU, the system 1100 may include a user interface 1122. As discussed, this interface can be any input/output device for viewing the rendered text.

Figure 12:
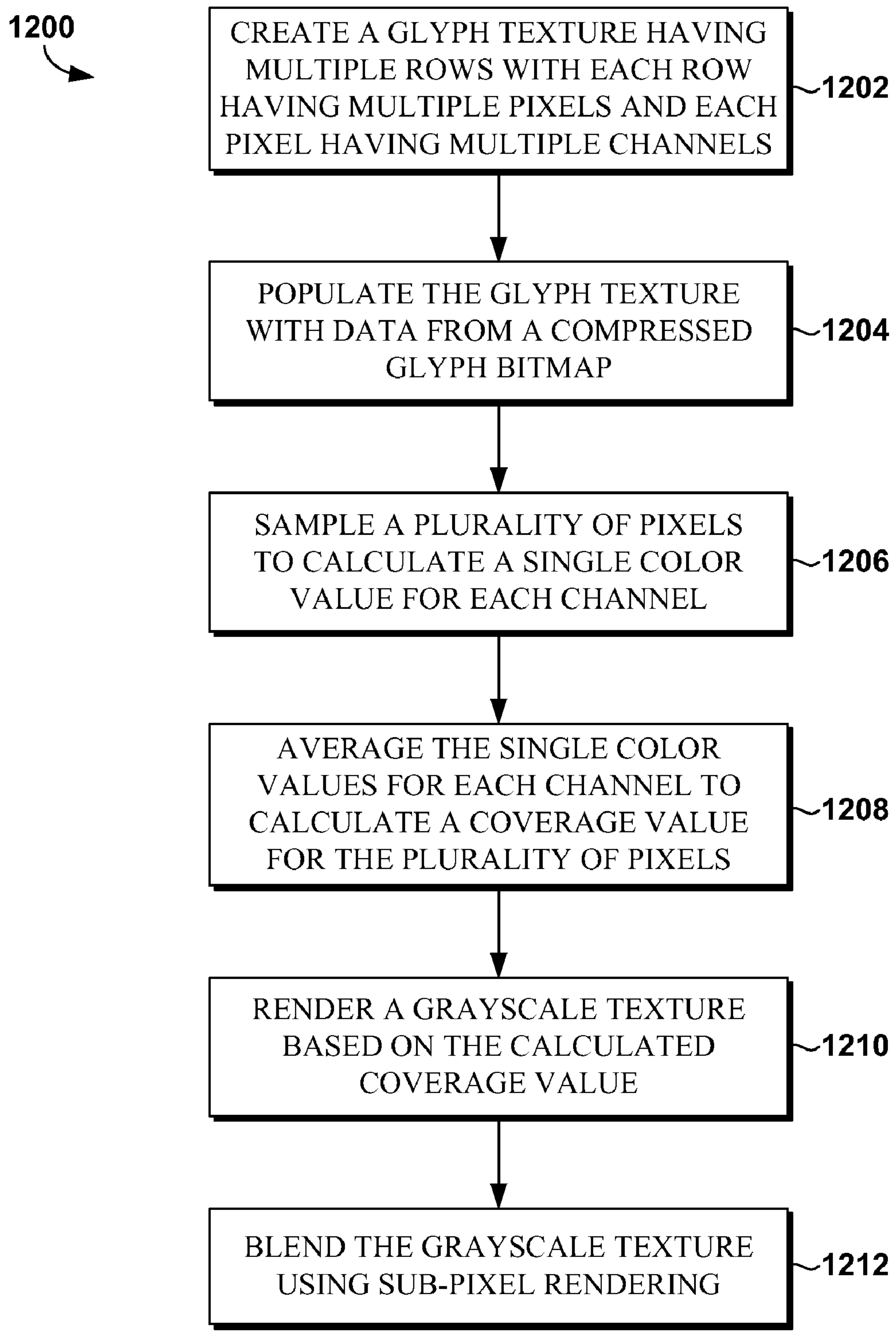
FIG. 12 illustrates a method in accordance with one embodiment of the present invention for merging, filtering, rendering, and blending glyphs with a GPU.

FIG. 12 illustrates a method 1200 in accordance with one embodiment of the present invention for merging, filtering, rendering, and blending glyphs with a GPU. At 1202, the method 1200 creates a glyph texture. The glyph texture may include multiple rows with each row having multiple pixels and each pixel having multiple channels as illustrated and discussed above.

At 1204, the method 1200 populates the glyph texture with data from a compressed glyph bitmap. FIGS. 3B and 4B illustrate one of many possible populated glyph textures. In one embodiment, the population step includes transferring a first row of data from the compressed glyph bitmap into a first color channel of the current row of the glyph texture. A second row is transferred from the compressed glyph bitmap into a second color channel of the current row of the glyph texture. This process is repeated for the current row until a number of color channels in that row are populated. In one embodiment of the present invention the number of color channels populated per row is three for odd-numbered rows in the glyph texture and two for even-numbered rows in the glyph texture. In another embodiment, the number of color channels populated per row is three for all the rows with glyph texture. The population continues in the next row after a number of color channels in the current row are populated.

At 1206, the method 1200 samples a plurality of pixels that calculate a single color value for each channel. Specifically, FIG. 9B illustrates a bilinear filter applied to two rows, each row including six pixels. At 1208, the method 1200 averages the single color values for each channel to calculate a coverage value for the plurality of pixels. Specifically, in FIG. 9B the values in item 954, 958, 962 illustrate one possible way of averaging the color channels.

At 1210, the method 1200 renders a gray scale texture based on the calculated coverage values. An example of the gray scale texture is illustrated in FIG. 6, item 600. Finally, at 1212, the method 1200 may blend the grayscale texture using sub-pixel rendering.

Alternative embodiments and implementations of the present invention will become apparent to those skilled in the art to which it pertains upon review of the specification, including the drawing figures. Accordingly, the scope of the present invention is defined by the appended claims rather than the foregoing description.

The invention claimed is:

1. One or more computer-readable storage media having computer-useable instructions embodied thereon to perform, by execution by at least one computing device having at least one processor and at least one memory, a method for rendering glyphs, the method comprising:

receiving a plurality of compressed glyph bitmaps having a first color depth;

decompressing, by said at least one processor, at least a portion of the plurality of compressed glyph bitmaps to create a plurality of glyph textures having a second color depth, wherein the decompressing includes packing a plurality of rows of data from a glyph bitmap into a single row of a glyph texture, wherein the single row includes a plurality of sub-rows of color data;

merging the plurality of glyph textures into a merged texture to identify overlapping rows of color data;

filtering the merged texture to create a grayscale texture containing a plurality of merged glyphs; and rendering the grayscale texture to display the plurality of merged glyphs.

2. The media of claim 1, wherein the first color depth includes a 1 bit-per-pixel monochrome format and the second color depth includes a 32 bit-per-pixel red, green, blue, and alpha format.

3. The media of claim 1, wherein packing includes vertical color packing, comprising packing every five rows of data from the compressed glyph bitmap into two rows in the glyph texture.

4. The media of claim 1, wherein packing includes vertical color packing, comprising compressing 30 pixels of data from the compressed glyph bitmap into 12 pixels of color data enabling filtering to be completed with three samples.

5. The media of claim 1, wherein packing includes vertical color packing, comprising the following steps:

a. drawing the first row of data from the compressed glyph bitmap in a first color in a first row of the glyph texture;

b. drawing the second row of data from the compressed glyph bitmap in a second color in the first row of the glyph texture;

c. drawing the third row of data from the compressed glyph bitmap in a third color in the first row of the glyph texture;

d. drawing the fourth row of data from the compressed glyph bitmap in a second color in a second row of the glyph texture;

e. drawing the fifth row of data from the compressed glyph bitmap in a first color in the second row of the glyph texture; and f. repeating steps a through e until all the data from the decompressed bitmap is packed into subsequent rows in the glyph texture.

6. The media of claim 1, wherein packing includes horizontal color packing, comprising compressing 6 pixels of data from the compressed bitmap into 6 pixels of color data enabling filtering to be completed with one sample.

7. The media of claim 1, wherein packing includes horizontal color packing, comprising the following steps:

a. duplicating each row of data from the compressed glyph bitmap two times to create three rows of duplicated data;

b. drawing the first row of duplicated data in a first color in a first row of the glyph texture;

c. drawing the second row of duplicated data in a second color in the first row of the glyph texture and offsetting the second color row from the first color row in a first direction;

d. drawing the third row of duplicated data in a third color in the first row of the glyph texture and offsetting the third color row from the first color row in a second direction, wherein the second direction is opposite the first direction; and e. moving to the next row in the glyph texture and repeating steps a through d with the next row of duplicated data from the compressed glyph bitmap until all the data from the decompressed bitmap is packed into subsequent rows in the glyph texture.

8. The media of claim 1, wherein merging includes the following steps:

a. clearing the merged texture to transparent black;

b. transferring the rows of data from the plurality of glyph textures to the merged texture;

c. lighting each pixel covered by one or more rows of data in the merged texture; and d. rendering vertices using a pixel shader that outputs opaque colors for each lighted pixel.

9. The media of claim 1, wherein filtering includes applying a bilinear filter and a weighted average.

10. The media of claim 1, wherein the method further comprises blending the grayscale texture using sub-pixel rendering and displaying the blended plurality of glyphs.

11. The media of claim 1, wherein the compressed glyph bitmap is a run-length encoded bitmap.

12. A system for rendering glyphs with a graphics processing unit (GPU), the GPU having a plurality of modules, the system comprising:

a reception module residing on the GPU and configured to receive a plurality of compressed glyph bitmaps having a first color depth;

a decompression module residing on the GPU and configured to decompress at least a portion of the plurality of compressed glyph bitmaps to create a plurality of glyph textures having a second color depth;

a packing module residing on the GPU and configured to place a plurality of rows of data from the glyph bitmap into a single row of a glyph texture, wherein the single row includes a plurality of rows of color data;

a merging module residing on the GPU and configured to merge the plurality of glyph textures into a merged texture to identify overlapping rows of color data;

a filtering module residing on the GPU and configured to filter the merged texture to create a grayscale texture containing a plurality of merged glyphs; and a rendering module residing on the GPU and configured to render the grayscale texture to display the plurality of merged glyphs.

13. The system of claim 12, further comprising a blending module residing on the GPU and configured to blend the grayscale texture using sub-pixel rendering and display the blended plurality of glyphs.

14. One or more computer-readable storage media having computer-useable instructions embodied thereon to perform, by execution by at least one computing device having at least one processor and at least one memory, a method for rendering glyphs, said method comprising:

creating a glyph texture having a plurality of rows including a plurality of pixels, wherein each pixel has a plurality of color channels; and populating, by said at least one processor, the glyph texture with data from a glyph bitmap, wherein populating includes transferring a first row of data from the glyph bitmap into a first color channel of a current row of the glyph texture, transferring a second row of data from the glyph bitmap into a second color channel of the current row of the glyph texture, and moving to a next row of the glyph texture after a number of color channels in the current row are populated.

15. The media of claim 14, the method further comprises:

repeating the populating step until all the data from the glyph bitmap is transferred into the glyph texture;

sampling a plurality of pixels to calculate a single color value for each channel of the sampled pixels;

averaging the single color values for each channel to calculate a coverage value for the plurality of pixels; and rendering a grayscale texture based on the calculated coverage value.

16. The media of claim 14, wherein the number of color channels populated per row is three for odd numbered rows of the glyph texture and two for even numbered rows of the glyph texture.

17. The media of claim 14, wherein the number of color channels populated per row is three for all rows of the glyph texture.

18. The media of claim 14, the method further comprises merging a plurality of populated glyph textures into a merged texture to identify overlapping color channels.

19. The media of claim 14, wherein sampling includes applying a bilinear filter to the plurality of pixels and averaging includes applying a non-linear weighted average to the single color values.

20. The media of claim 14, further comprising blending the grayscale texture using sub-pixel rendering.

* * * * *